US009672924B2

(12) United States Patent
Cho et al.

(10) Patent No.: US 9,672,924 B2
(45) Date of Patent: Jun. 6, 2017

(54) NONVOLATILE MEMORY DEVICE AND OPERATING METHOD THEREOF

(71) Applicant: Samsung Electronics Co., Ltd., Suwon-si (KR)

(72) Inventors: Yongsung Cho, Suwon-si (KR); Ohsuk Kwon, Seoul (KR); Kihwan Choi, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 345 days.

(21) Appl. No.: 14/458,771

(22) Filed: Aug. 13, 2014

(65) Prior Publication Data
US 2015/0052294 A1    Feb. 19, 2015

(30) Foreign Application Priority Data

Aug. 14, 2013 (KR) .......................... 10-2013-0096565

(51) Int. Cl.
| G11C 16/08 | (2006.01) |
|---|---|
| G11C 16/10 | (2006.01) |
| G11C 16/24 | (2006.01) |
| G11C 16/26 | (2006.01) |
| G11C 16/34 | (2006.01) |
| G06F 12/02 | (2006.01) |

(52) U.S. Cl.
CPC .......... *G11C 16/24* (2013.01); *G06F 12/0246* (2013.01); *G11C 16/08* (2013.01); *G11C 16/10* (2013.01); *G11C 16/26* (2013.01); *G11C 16/3459* (2013.01); *G06F 2212/7201* (2013.01)

(58) Field of Classification Search
CPC ......... G11C 16/08; G11C 16/10; G11C 16/24; G11C 16/26; G11C 16/3459; G06F 12/0246; G06F 2212/7201
See application file for complete search history.

(56) References Cited

U.S. PATENT DOCUMENTS

| 6,292,397 | B1 | 9/2001 | Kim |
| 7,321,509 | B2 | 1/2008 | Chen et al. |
| 7,652,929 | B2 | 1/2010 | Li |
| 7,894,269 | B2 | 2/2011 | Li |
| 2007/0183240 | A1 | 8/2007 | Maruyama et al. |
| 2008/0205140 | A1* | 8/2008 | Lee ...................... G11C 11/5671 365/185.03 |
| 2010/0259995 | A1* | 10/2010 | Joo ........................ G11C 16/24 365/185.25 |
| 2011/0305091 | A1* | 12/2011 | Lee ........................ G11C 16/32 365/185.22 |
| 2012/0213004 | A1 | 8/2012 | Yun et al. |
| 2012/0331210 | A1 | 12/2012 | Jeong et al. |

FOREIGN PATENT DOCUMENTS

| JP | 2007-172747 | 7/2007 |
| KR | 1020010002603 A | 1/2001 |
| KR | 1020120094710 A | 8/2012 |

* cited by examiner

*Primary Examiner* — Aracelis Ruiz

(74) *Attorney, Agent, or Firm* — Myers Bigel, P.A.

(57) ABSTRACT

An operating method of a nonvolatile memory device includes receiving a read command from a memory controller; determining a read mode based on the received read command, controlling a precharge time and an offset of a precharge control signal according to the determination result, and precharging a sensing bit line among bit lines to a precharge voltage based on the controlled precharge control signal. The sensing bit line is a bit line being precharged according to the determined read mode among the bit lines.

20 Claims, 18 Drawing Sheets

NONVOLATILE MEMORY DEVICE AND OPERATING METHOD THEREOF

CROSS-REFERENCE TO RELATED APPLICATIONS

This U.S. non-provisional patent application claims priority under 35 U.S.C. §119 to Korean Patent Application No. 10-2013-0096565, filed on Aug. 14, 2013, the entire contents of which are hereby incorporated by reference.

TECHNICAL FIELD

The present inventive concept herein relates to semiconductor memories, and more particularly, to write and read methods of a nonvolatile memory device.

BACKGROUND OF THE INVENTION

A semiconductor memory device may be embodied using semiconductor, such as silicon Si, germanium Ge, gallium arsenide GaAs, indium phosphide InP, etc. A semiconductor memory device may be classified into a volatile memory device and a nonvolatile memory device.

A volatile memory device loses its stored data when its power supply is interrupted. Examples of a volatile memory device are a static RAM (SRAM), a dynamic RAM (DRAM), a synchronous DRAM (SDRAM), etc. A nonvolatile memory device retains its stored data even when its power supply is interrupted. Examples of a nonvolatile memory device are a read only memory (ROM), a programmable ROM (PROM), an electrically programmable ROM (EPROM), an electrically erasable programmable ROM (EEPROM), a flash memory device, a phase-change RAM (PRAM), a magnetic RAM (MRAM), a resistive RAM (RRAM), a ferroelectric RAM (FRAM), etc.

As semiconductor integration technology is improved, an interconnection space between word lines and bit lines in a semiconductor chip is becoming small. Problems such as reliability degradation and performance degradation of a semiconductor memory device occur due to an increase of coupling between interconnections.

SUMMARY

One aspect of exemplary embodiments of the inventive concept provide an operating method of a nonvolatile memory device. The operating method may include receiving a read command from a memory controller; determining a read mode based on the received read command; controlling a precharge time and an offset of a precharge control signal according to the determination result; and precharging a sensing bit line among bit lines to a precharge voltage based on the controlled precharge control signal. The sensing bit line is a bit line being precharged according to the determined read mode among the bit lines. The precharge time comprises first and second sections. The offset is a level difference between the precharge control signal of the first section and the precharge control signal of the second section.

In exemplary embodiments, the determining a read mode on the basis of the received read command comprises determining whether the received read command indicates a first read mode or a second read mode, wherein the first read mode is a full-page read mode and the second read mode is a half-page read mode.

In exemplary embodiments, in the case that the received read command is the second read mode, a bit line adjacent to the sensing bit line is in a ground state.

In exemplary embodiments, the controlling precharge time and an offset of a precharge control signal according to the determination result comprises setting the first section of the precharge control signal to a first time when the received read command indicates the first read mode and setting the first section of the precharge control signal to a second time which is less than the first time when the received read command indicates the second read mode.

In exemplary embodiments, the controlling precharge time and an offset of a precharge control signal according to the determination result further comprises setting an offset of the precharge control signal to a first reference value when the received read command indicates the first read mode and setting the offset of the precharge control signal to a second reference value which is greater than the first reference value when the received read command indicates the second read mode.

In exemplary embodiments, time that the sensing bit line is precharged based on a precharge control signal having the first section of the second time and the offset of the second reference value is less than a time that the sensing bit line is precharged based on a precharge control signal having the first section of the first time and the offset of the first reference value.

In exemplary embodiments, the controlling precharge time and an offset of a precharge control signal according to the determination result comprises setting a slope of the precharge control signal to a first slope when the received read command indicates the first read mode and setting the slope of the precharge control signal to a second slope which is greater than the first slope when the received read command indicates the second read mode, and wherein the slope indicates a rate of voltage level increment in the precharge control signal of the first section.

In exemplary embodiments, the operating method of a nonvolatile memory device further comprises sensing a voltage change of the precharged sensing bit lines to detect a program state of memory cells connected to the sensing bit lines.

Another aspect of exemplary embodiments of the inventive concept provide a method including receiving a read command from a memory controller, determining a read mode based on the read command, the read mode comprising a first read mode for reading an entire page of a memory device and a second mode for reading a portion of a page of the memory device, generating a precharge control signal having first and second time segments and having a steady state offset between voltage levels of the precharge control signal during the first and second time segments based on the read mode, and precharging a sensing bit line of a plurality of bit lines using the precharge control signal.

In other embodiments, the steady state offset for the first mode is less than the steady state offset for the second mode.

In still other embodiment, the first time segment for the first mode is longer than the first time segment for the second mode.

In still other embodiments, a first combined time of the first and second segments for the first mode is longer than a second combined time of the first and second time segments for the second mode.

In still other embodiments, ones of the plurality of bit lines adjacent to the sensing bit line are in a ground state for the second mode.

In still other embodiments, the method further comprises performing a read operation on the memory device responsive to precharging the sensing bit line. Another aspect of exemplary embodiments of the inventive concept also provide a nonvolatile memory device. The nonvolatile memory device may include a memory cell array including a plurality of memory cells and is connected to a plurality of word lines and a plurality of bit lines; control logic configured to receive a read command from a memory controller and control and precharge time and an offset of a precharge control signal on the basis of the received read command to output them; an input/output circuit configured to be connected to the bit lines, receive the precharge control signal form the control logic and precharge a sensing bit line among the bit lines on the basis of the received precharge control signal. The sensing bit line is a bit line being precharged according to a determined read mode among the bit lines. The precharge time comprises first and section sections. The offset is a voltage level difference between the precharge control signal of the first section and the precharge control signal of the second section.

In exemplary embodiments, the read command comprises information of any one of first and second read modes, wherein the first read mode is a full-page read mode and the second read mode is a half-page read mode.

In exemplary embodiments, when the read command comprises the information of the first read mode information, the control logic is configured to set the first section of the precharge control signal to first time, and when read command comprises the information of the second read mode, the control logic is configured to set the first section of the precharge control signal to second time which is less than the first time.

In exemplary embodiments, when the read command comprises the information of the first read mode, the control logic is configured to set the offset of the precharge control signal to a first reference value, and when the read command comprises the information of the second read mode, the control logic is configured to set the offset of the precharge control signal to a second reference value which is greater than the first reference value.

In exemplary embodiments, when the read command comprises the information of the first read mode, the control logic is configured to set a slope of the precharge control signal to a first slope value, and when the read command comprises the information of the second read mode, the control logic is configured to set a slope of the precharge control signal to a second slope value which is greater than the first slope value.

In exemplary embodiments, the input/output circuit is configured to sense a voltage change of the precharged sensing bit line to detect a program state of a part of memory cells included in the memory cell array.

Another aspect of exemplary embodiments of the inventive concept also provide a program method of a nonvolatile memory device. The program method may include receiving a write command and write data from a memory controller; and performing a plurality of program loops so that the received write data is written according to the received write command. Each of the program loops comprises a program operation writing the received write data and a verify operation verifying the written write data. The performing the program loops comprises controlling precharge time and an offset of a precharge control signal when the number of program loops exceeds a reference value and performing the verify operation on the basis of the controlled precharge control signal. The precharge time comprises first and sec-
tion sections. The offset is a voltage level difference between the precharge control signal of the first section and the precharge control signal of the second section.

In exemplary embodiments, the controlling precharge time and an offset of a precharge control signal when the number of program loops exceeds a reference value and performing the verify operation on the basis of the controlled precharge control signal comprises controlling the precharge control signal so that the first section of the precharge control signal is shorter than a first section of the precharge control signal when the number of program loops is less than a reference value.

In exemplary embodiments, the controlling precharge time and an offset of a precharge control signal when the number of times of program loops exceeds a reference value and performing the verify operation on the basis of the controlled precharge control signal comprises controlling the precharge control signal so that the offset of the precharge control signal is greater than an offset of the precharge control signal when the number of times of program loops is less than a reference value.

In exemplary embodiments, the controlling precharge time and an offset of a precharge control signal when the number of times of program loops exceeds a reference value and performing the verify operation on the basis of the controlled precharge control signal comprises controlling the precharge control signal so that a slope of the precharge control signal is greater than a slope of the precharge control signal when the number of times of program loops is less than a reference value, and wherein the slope is a rate of voltage level increment in the precharge control signal during the first section.

In exemplary embodiments, the controlling precharge time and an offset of a precharge control signal when the number of times of program loops exceeds a reference value and performing the verify operation on the basis of the controlled precharge control signal comprises precharging a verify bit line on the basis of the controlled precharge control signal; and verifying a program state of a memory cell connected to the verify bit line, wherein bit lines adjacent to the verify bit line are in a ground state.

BRIEF DESCRIPTION OF THE FIGURES

Embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF EMBODIMENTS

Figure 1:
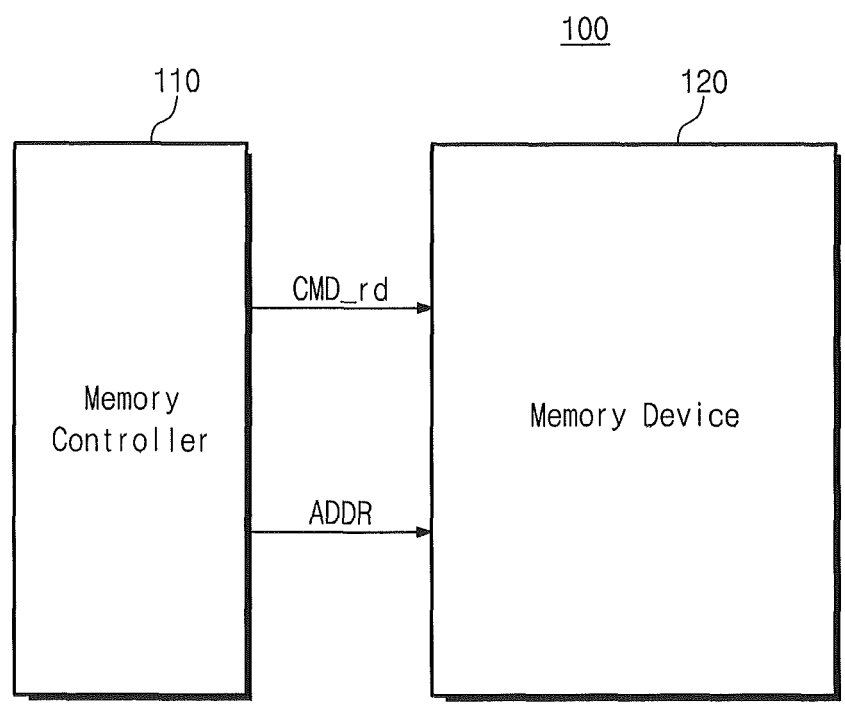
FIG. 1 is a block diagram illustrating a nonvolatile memory system in accordance with an embodiment of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout the description.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present inventive concept.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional views that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. More-over, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and device structures thereon, as would be illustrated by a plan view of the device/structure.

A nonvolatile memory device in accordance with an embodiment of the inventive concept can control a precharge control signal according to a read command received from a memory controller. The precharge control signal VBLSHF indicates a switching signal for precharging a bit line. For example, if a page of a nonvolatile memory device is 8 KB and a read command received from a nonvolatile memory device indicates a 4 KB read operation, the nonvolatile memory device selects and precharges a portion of bit lines to perform the 4 KB read operation. In this case, bit lines adjacent to the precharged bit lines are in a ground state. Accordingly, the nonvolatile memory device can increase an offset value of a bit line precharge signal and can reduce precharge time. Thus, because the time that a bit line is precharged to a precharge voltage is reduced, a nonvolatile memory device having improved performance may be provided.

FIG. 1 is a block diagram illustrating a nonvolatile memory system in accordance with an embodiment of the inventive concept. Referring to FIG. 1, a nonvolatile memory system 100 includes a memory controller 110 and a nonvolatile memory device 120.

The memory controller 110 can receive a read request from an external device (e.g., a host, an application processor, etc.) and can control the nonvolatile memory device 120 in response to the received read request. For example, the memory controller 110 can transmit a read command CMD_rd and an address ADDR to the nonvolatile memory device 120 according to the received read request.

The nonvolatile memory system 100 can provide various read modes. The nonvolatile memory device 120 may include a plurality of pages. Each of the pages can have a memory capacity of 8 KB. In this case, the nonvolatile memory system 100 can provide a read mode of various units such as 4 KB, 8 KB, etc. The memory controller 10 transmits a read command CMD_rd including read unit information to the nonvolatile memory device 120.

The nonvolatile memory device 120 can receive a read command CMD_rd and an address ADDR from the memory controller 110. The nonvolatile memory device 120 performs a read operation according to the received read command CMD_rd and the address ADDR. The nonvolatile memory device 120 can control precharge time and an offset of a bit line on the basis of the received read command CMD_rd.

Figure 2:
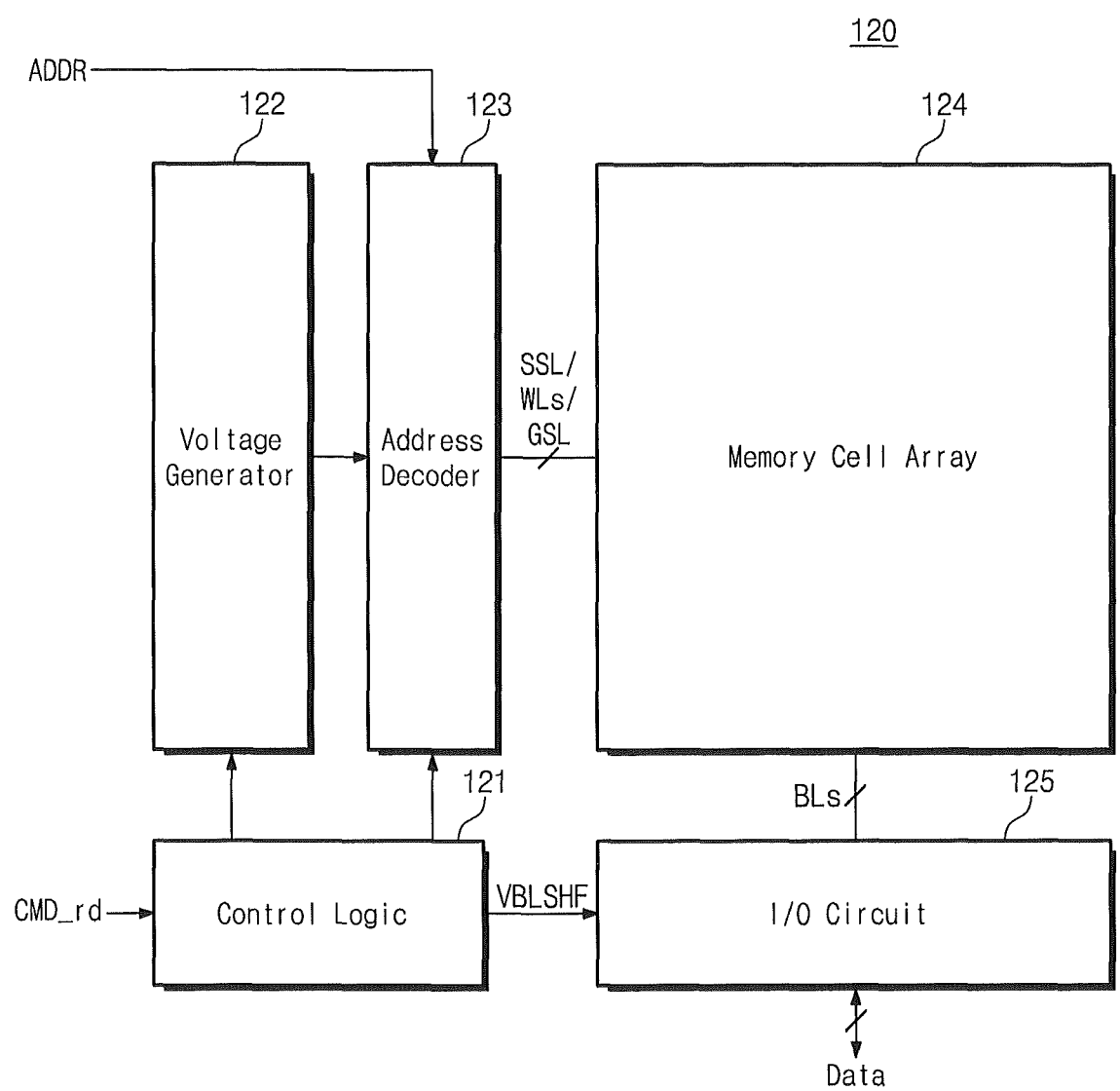
FIG. 2 is a block diagram illustrating a nonvolatile memory device illustrated in FIG. 1 in detail.

FIG. 2 is a block diagram illustrating a nonvolatile memory device illustrated in FIG. 1 in detail. For ease of description, it will be assumed that a bit line being precharged according to a read mode is called a sensing bit line. It will also be assumed that the nonvolatile memory device 120 provides first and second read modes. It will also be assumed that each of the pages has a capacity of 8 KB, the first read mode indicates a read operation (for example, a full-page read mode) of 8 KB data and the second read mode indicates a read operation (for example, a half-page read mode) of 4 KB. That is, the first read mode indicates a read mode of any one of the pages and the second read mode indicates a read mode of a part of any one of the pages. The first read mode may be an all bit line structure and the second read mode may be an even-odd bit line structure. However, the inventive concept may not be limited thereto. The nonvolatile memory device 120 can provide various read modes and each of the pages is not limited to a capacity of 8 KB.

Referring to FIG. 2, the nonvolatile memory device 120 includes control logic 121, a voltage generator 122, an address decoder 123, a memory cell array 124 and an input/output circuit 126.

The control logic 121 can control the voltage generator 122, the address decoder 123, and the input/output circuit 125 according to a read command CMD_rd received from the memory controller 110 of FIG. 1. The control logic 121 can determine an operation mode of the received read command CMD_rd. For example, the control logic 121 can determine whether the read command CMD_rd indicates the first read mode or whether the read command CMD_rd indicates the second read mode. If each of the pages has a capacity of 8 KB, the first read operation indicates a read operation of data of 8 KB and the second read operation indicates a read operation of data of 4 KB.

The control logic 121 can control a precharge control signal VBLSHF according to the determination result. For example, in the case that the received read command CMD_rd indicates the first read mode, the control logic 121 can set an offset of the precharge control signal VBLSHF as a first reference value and can set a first section of precharge time as a first reference time. In the case that the received read command CMD_rd indicates the second read mode, the control logic 121 can set an offset of the precharge control signal VBLSHF as a second reference value and can set a first section of precharge time as a second reference time. The first reference value is less than the second reference value. The first reference time is greater than the second reference time.

Sensing bit lines among a plurality of bit lines BLs can be charged to a precharge voltage according to the precharge control signal VBLSHF.

The voltage generator 122 can generate various voltages to be applied to a plurality of word line WLs. For example, the voltage generator 122 can generate a plurality of select read voltages and a plurality of unselect read voltages for determining states of a plurality of memory cells included in the memory cell array 124.

The address decoder 123 can receive an address ADDR from the memory controller 110. The address decoder 123 can decode the received address ADDR to select any one of the word lines WLs. The address decoder 123 can sequentially apply a plurality of select read voltages to the selected word line and can apply a plurality of unselect read voltages to unselected word lines.

The memory cell array 124 is connected to the address decoder 123 through the word lines WLs and connected to the input/output circuit 125 through the bit lines BLs. The memory cell array 124 includes a plurality of memory blocks and each of the memory blocks is constituted by a plurality of pages. The page includes a plurality of memory cells.

The input/output circuit 125 is connected to the memory cell array 124 through the bit lines BLs. The input/output circuit 125 can sense a voltage change of the bit lines BLs to output data or can control voltages of the bit lines BLs to write data in the memory cell array 124. The input/output circuit 125 can precharge sensing bit lines among the bit lines BLs on the basis of the precharge control signal VBLSHF.

According to an embodiment of the inventive concept, the nonvolatile memory device 120 supports various read modes. The nonvolatile memory device 120 operates in any one read mode among various read modes according to the received read command CMD_rd. The nonvolatile memory device 120 can control the precharge control signal VBLSHF according to a read mode. Thus, because the precharge time of a bit line may be reduced, a nonvolatile memory device having improved performance is provided.

Figure 3:
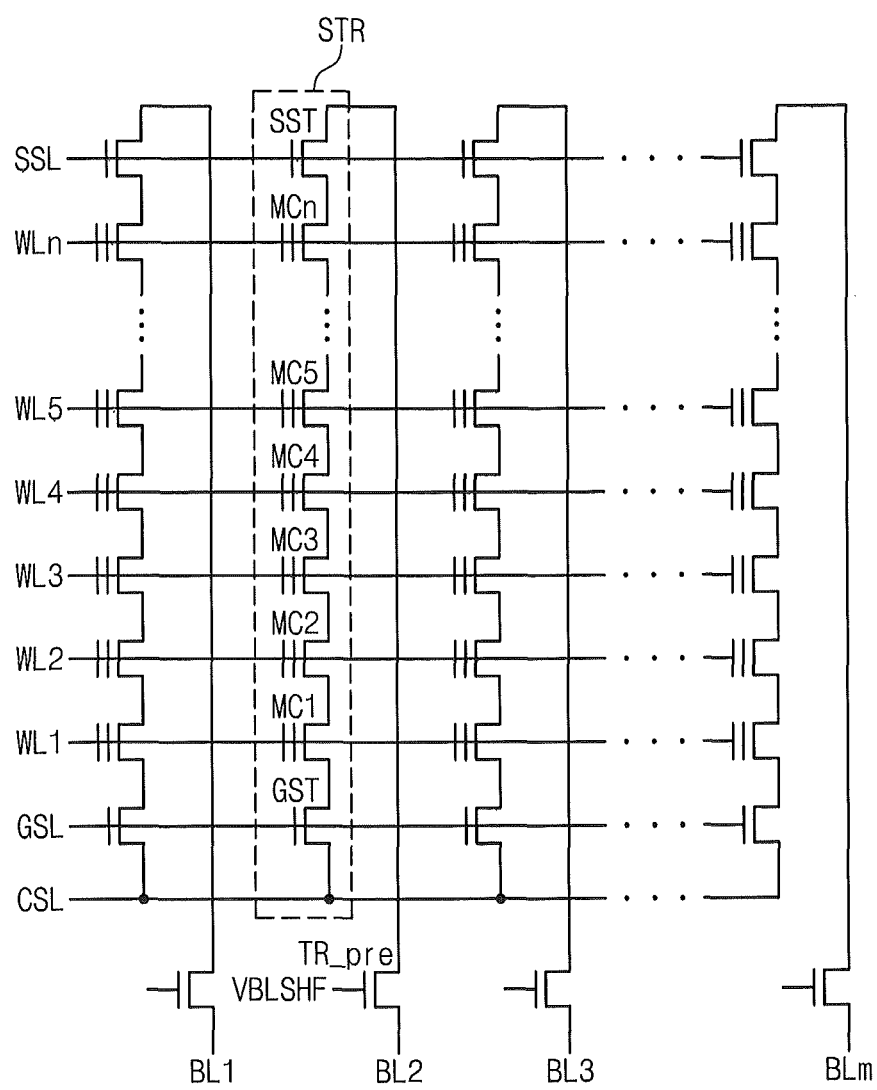
FIG. 3 is a circuit diagram illustrating a memory cell array illustrated in FIG. 2 in detail.

FIG. 3 is a circuit diagram illustrating a memory cell array illustrated in FIG. 2 in detail. Referring to FIGS. 2 and 3, the memory cell array 124 includes a plurality of strings STR. Each of the strings STR includes a string select transistor SST, a ground select transistor GST, and a plurality of memory cells MC1~MCn. The memory cells MC1~MCn are connected in series between the string select transistor SST and the ground select transistor GST.

One end of the string select transistor SST is connected to a bit line BL. A gate of the string select transistor SST is connected to a string select line SSL. One end of the ground select transistor GST is connected to a common source line CSL. A gate of the ground select transistor GST is connected to a ground select line GSL. Gates of the memory cells MC1~MCn are connected to a plurality of word lines WL1~WLn.

Each of a plurality of bit lines BL1~BLm may be charged to a precharge voltage by a precharge control signal VBLSHF. The bit lines BL1~BLm are connected to precharge switches TR pre. Each of the precharge switches TR pre can charge a bit line to a precharge voltage in response to a precharge control signal VBLSHF.

The control logic 121 can control the precharge control signal VBLSHF according to a read command CMD_rd. For example, when the read command CMD_rd indicates the second read mode, sensing bit lines among the bit lines BL1~BLm are charged to the precharge voltage. The rest among the bit lines BL1~BLm are in a ground state.

In the second read mode, the sensing bit lines may be even bit lines (BL2, BL4, BL6, ... ). The rest of the bit lines except the sensing bit lines may be odd bit lines (BL1, BL3, BL5, ... ). The even bit lines (BL2, BL4, BL6, ... ) are charged to the precharge voltage and the odd bit lines (BL1, BL3, BL5, ... ) are in a ground state. In this case, the control logic 121 can reduce precharge time by controlling the precharge control signal VBLSHF. For example, as a level of the precharge control signal VBLSHF becomes higher, a sensing bit line may be quickly charged to the precharge voltage.

Figure 4:
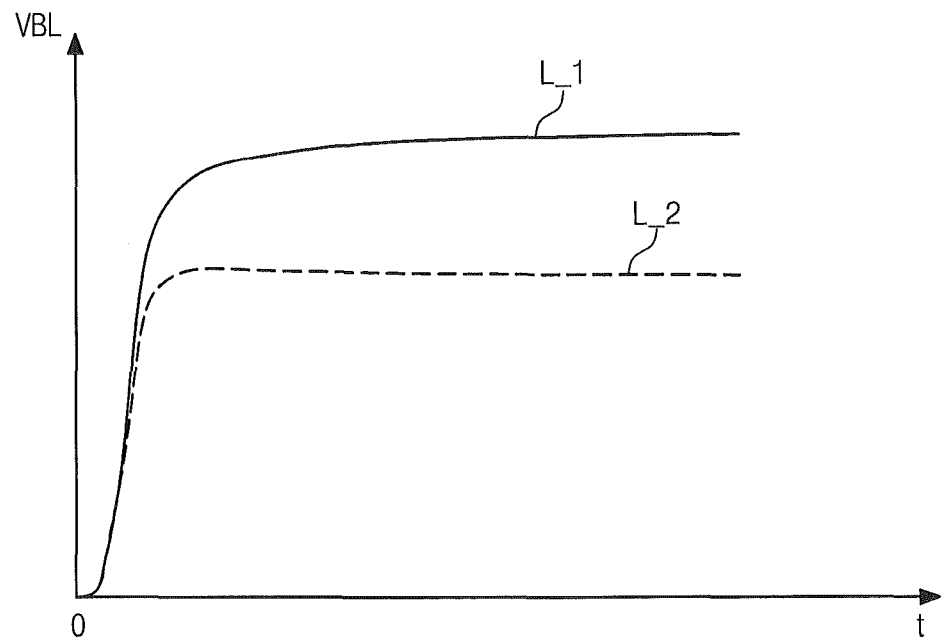
FIGS. 4 to 6 are graphs showing a voltage change of a sensing bit line by a state of an adjacent bit line.
Figure 5:
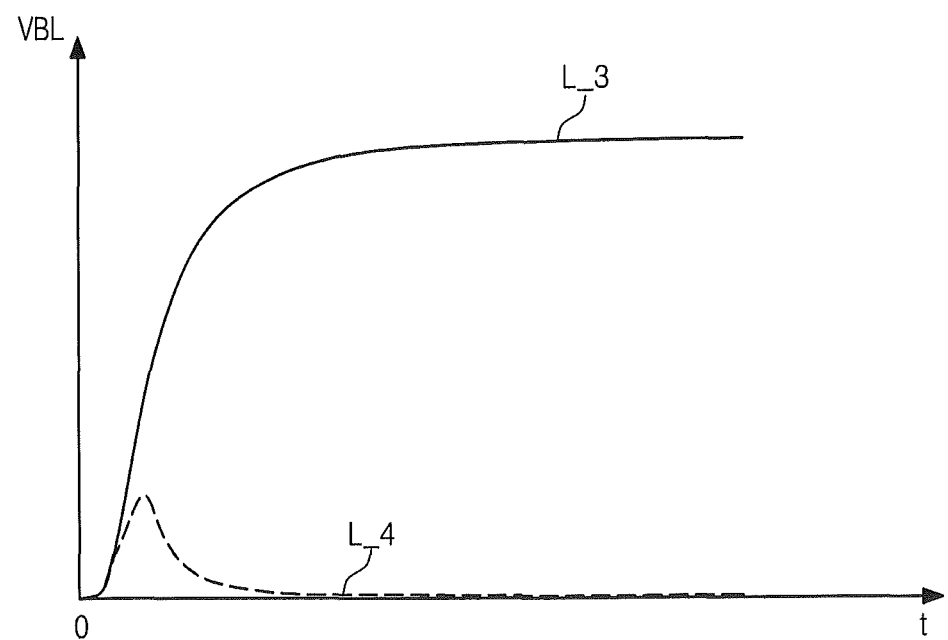
Figure 6:
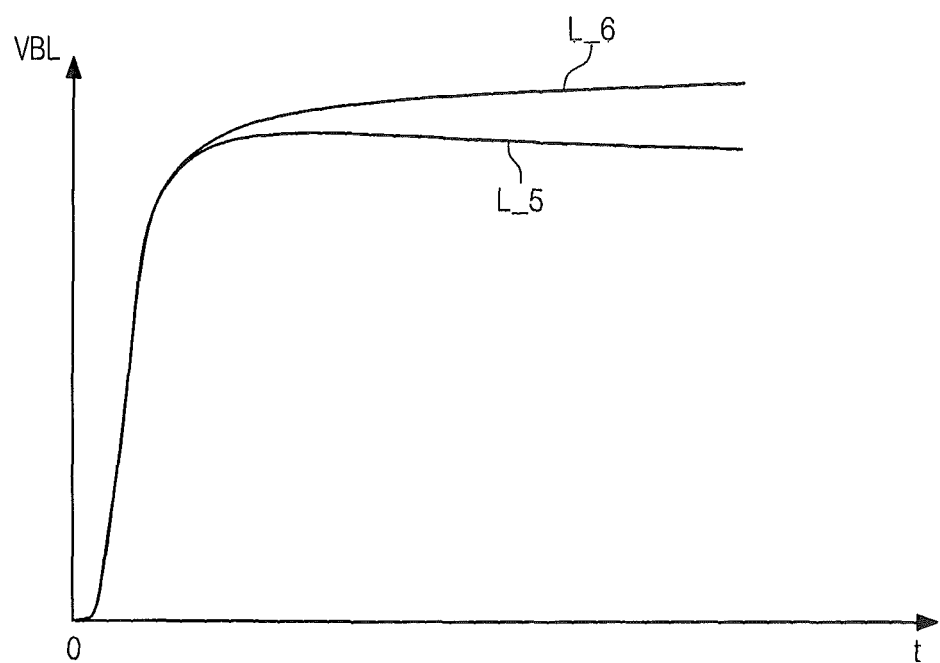

FIGS. 4 to 6 are graphs showing a voltage change of a sensing bit line by a state of an adjacent bit line.

An X axis indicates time and a Y axis indicates a bit line voltage VBL. FIG. 4 illustrates that an adjacent bit line is in an on-cell state, FIG. 5 illustrates that an adjacent bit line is in a ground state and FIG. 6 illustrates that an adjacent bit line is in an off-cell state.

Referring to FIGS. 4 to 6, first, third, and fifth lines L_1, L_3 and L_5 indicate a sensing bit line voltage. A second line L_2 indicates a voltage of an adjacent bit line of an on-cell state, a fourth line L_4 indicates a voltage of an adjacent bit line of a ground state and a sixth line L_6 indicates a voltage of an adjacent bit line of an off-cell state.

As illustrated in FIGS. 4 and 6, in the case that an adjacent bit line is precharged together with a sensing bit line (e.g., a case that the adjacent bit line is in an on-cell state or in an offset state) when the sensing bit line is precharged, since capacitance between bit lines does not develop, the sensing bit line is quickly precharged to the precharge voltage Vpre.

As illustrated in FIG. 5, in the case that an adjacent bit line is precharged together with a sensing bit line (for example, a case that the adjacent bit line is in a ground state) when the sensing bit line is precharged, capacitance between bit lines develops and thereby the sensing bit line is slowly precharged to the precharge voltage Vpre as compared with the case illustrated in FIGS. 4 and 6. That is, in the case that the adjacent bit line is in a ground state, to charge the sensing bit line to the precharge voltage Vpre, a longer precharge time may be required as compared with the case illustrated in FIGS. 4 and 6. In the case that the nonvolatile memory device 120 operates in the second read mode, a bit line adjacent to the sensing bit line may be in a ground state.

Figure 7:
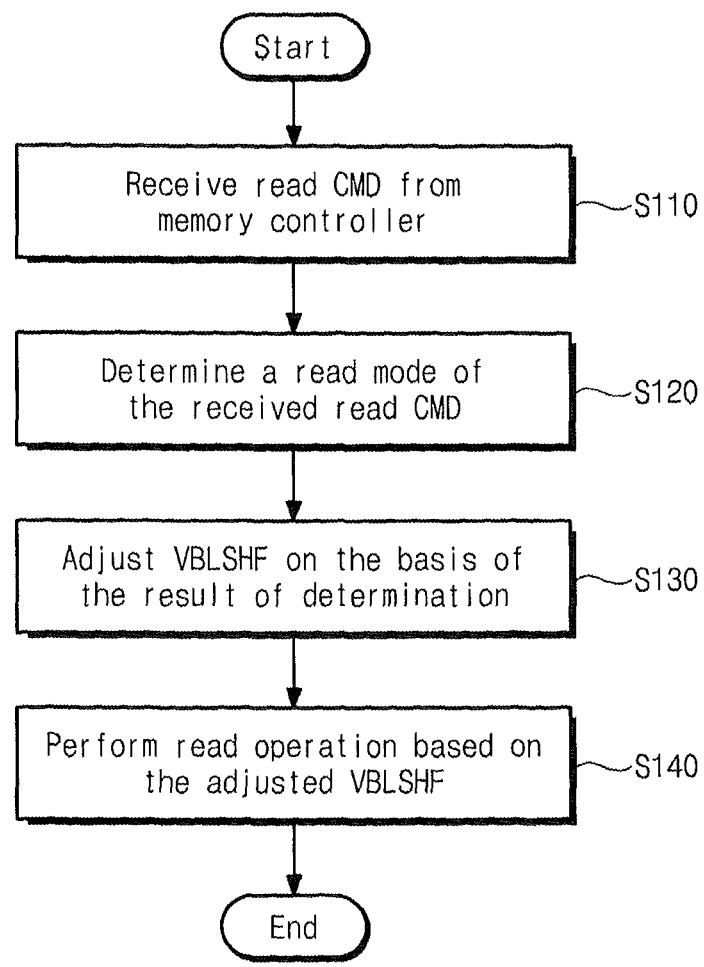
FIG. 7 is a flow chart illustrating operations of a nonvolatile memory device illustrated in FIG. 2.

FIG. 7 is a flow chart illustrating operations of a nonvolatile memory device illustrated in FIG. 2. Referring to FIGS. 2 and 7, at block S110, the nonvolatile memory device 120 may receive a read command CMD_rd from the memory controller 110.

At block S120, the nonvolatile memory device 120 may determine a read mode of the received read command CMD_rd. For example, the nonvolatile memory device 120 can provide first and second read modes. The read command CMD_rd can include operation mode information of any one of the first and second read modes. The nonvolatile memory device 120 can determine whether the received read command CMD_rd is the first read mode or the second read mode. The first read mode is a read operation on an entire portion of any one of a plurality of pages and the second read mode is a read operation on a portion of any one of the plurality of pages.

At block S130, the nonvolatile memory device 120 can control precharge time and an offset of the precharge control signal VBLSHF on the basis of the determination result.

At block S140, the nonvolatile memory device 120 performs a read operation on the basis of the controlled precharge control signal VBLSHF. The nonvolatile memory device 120 can perform a read operation by precharging sensing bit lines on the basis of the controlled precharge control signal VBLSHF and sequentially applying a plurality of read voltages to selected word lines.

According to the embodiments described above, the nonvolatile memory device 120 controls the precharge control signal VBLSHF according to the received read command CMD_rd. In the case that the received read command CMD_rd indicates the second read mode, the nonvolatile memory device 120 can reduce precharge time of a sensing bit line by increasing an offset of the precharge control signal VBLSHF and reducing precharge time of the precharge control signal VBLSHF. As a result, a nonvolatile memory device having improved performance and an operating method thereof are provided.

Figure 8:
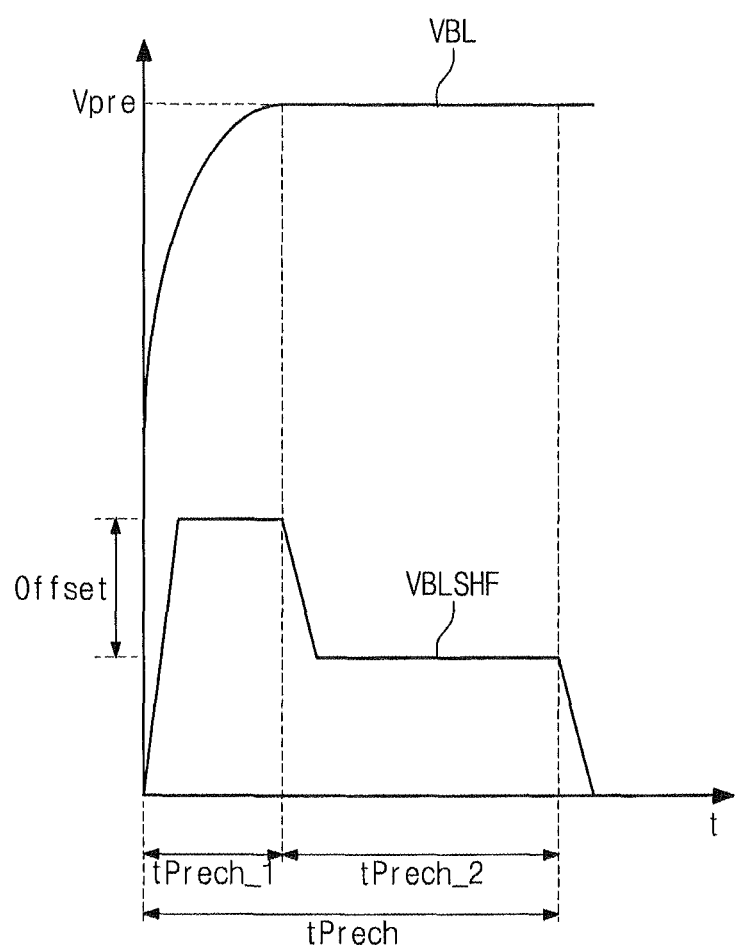
FIGS. 8 and 9 are drawings for explaining operations of FIG. 7 in further detail.
Figure 9:
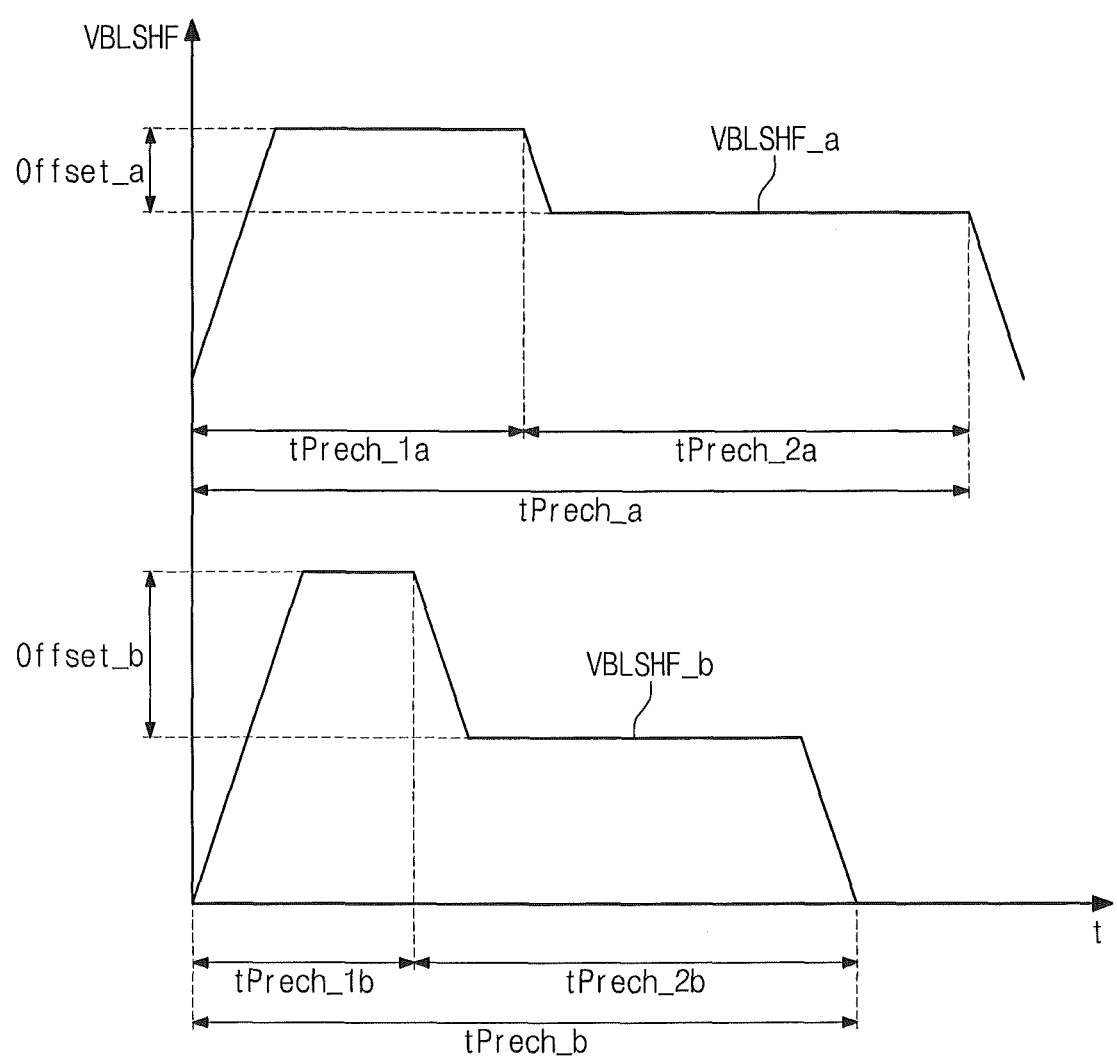

FIGS. 8 and 9 are drawings for explaining block S130 of FIG. 7 in detail. Referring to FIG. 8, the bit line voltage VBL is charged to the precharge voltage Vpre according to the precharge control signal VBLSHF. The precharge control signal VBLSHF is activated during precharge time tPrech. The precharge time tPrech is constituted by first and second sections tPrech_1 and tPrech_2. The bit line voltage VBL increases during the first section tPrech_1 of the precharge control signal VBLSHF. The time that the bit line voltage VBL reaches the precharge voltage Vpre can be controlled according to an offset of the precharge control signal VBLSHF. As the offset becomes greater, the time that the bit line voltage VBL reaches the precharge voltage Vpre is reduced. That is, as the offset of the precharge control signal VBLSHF becomes greater, the first section tPrech_1 of the precharge time tPrech is shortened and the precharge time tPrech of a bit line is reduced. The offset indicates a difference of signal levels between the first and second sections tPrech_1 and tPrech_2.

A control method of the precharge control signal VBLSHF in accordance with a read mode is described with reference to FIG. 9. Referring to FIG. 9, the nonvolatile memory device 120 can control the precharge control signal VBLSHF according to the received read command CMD_rd. A first precharge control signal VBLSHF_a is a precharge control signal according to the first read mode. A second precharge control signal VBLSHF_b is a precharge control signal according to the second read mode.

As described with reference to FIG. 3, in the case that the nonvolatile memory device 120 operates in the second read mode, bit lines adjacent to the sensing bit line may be in a ground state. As described with reference to FIGS. 4 to 6, when an adjacent bit line is in a ground state, the precharge time of the sensing bit line may be relatively long as compared with another case (for example, an adjacent bit line is in an on-cell state or an off-cell state).

Thus, when the nonvolatile memory device 120 operates in the second read mode, the nonvolatile memory device 120 controls the precharge control signal VBLSHF like the second precharge control signal VBLSHF_b. In this case, an offset (offset_b) of the second precharge control signal VBLSHF_b is greater than an offset (offset_a) of the first precharge control signal VBLSHF_a. A first section tPrech_1b of the second precharge control signal VBLSHF_b is shorter than a first section tPrech_1a of the first precharge control signal VBLSHF_a. Thus, aprecharge time tPrech_b of the second precharge control signal VBLSHF_b is shorter than a precharge time tPrech_a of the first precharge control signal VBLSHF_a.

According to the embodiments described above, in the case that an adjacent bit line is in a ground state, the nonvolatile memory device 120 can reduce the precharge time of the sensing bit line by increasing an offset of the precharge control signal VBLSHF and reducing the precharge time of the precharge control signal VBLSHF. As a result, a nonvolatile memory device having improved performance and an operating method thereof are provided.

Figure 10:
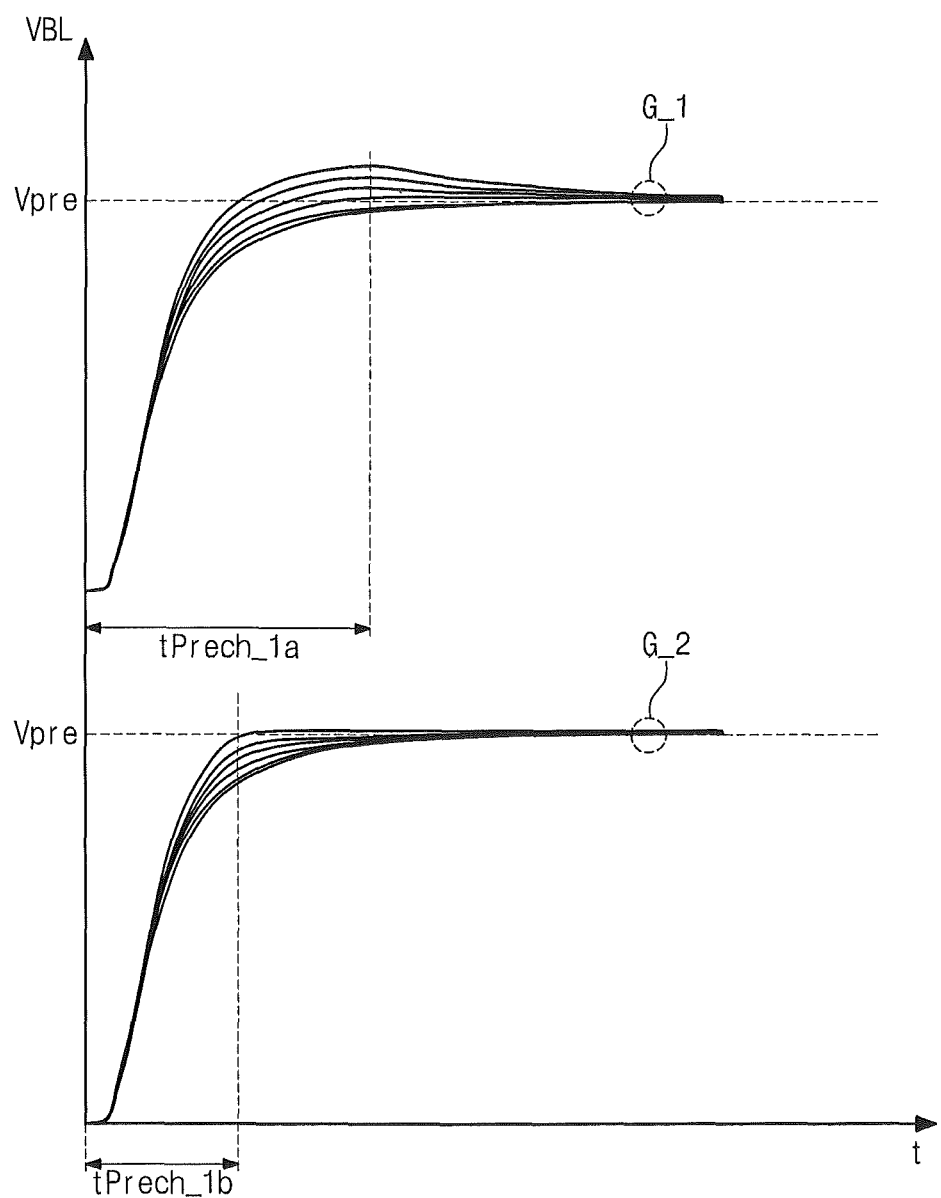
FIG. 10 is a graph illustrating a precharge time reduction effect in accordance with an embodiment of the inventive concept.

FIG. 10 is a graph illustrating a precharge time reduction effect in accordance with an embodiment of the inventive concept. First and second groups G_1 and G_2 are graphs showing a voltage change of a sensing bit line of which adjacent bit lines are in a ground state. The first group G_1 is a graph showing a voltage change of a sensing bit line to which the offset (offset_b) and the first section tPrech_1a are applied. In the case that an offset of the precharge control signal VBLSHF increases like the first group G_1, a sensing bit line voltage rapidly increases. However, after a certain period of time, the sensing bit line is overcharged. Accordingly, a reduction effect of the precharge time tPrech is insignificant.

The second group G_2 is a graph showing a voltage change of a sensing bit line to which the offset (offset_b) and the first section tPrech_1b of the second precharge control signal VBLSHF_b are applied. As illustrated by the second group G02, when an adjacent bit line is in a ground state, the precharge time tPrech can be reduced by increasing an offset of the precharge control signal VBLSHF and reducing the first section tPrech_1 of the precharge time tPrech. Thus, a nonvolatile memory device having improved performance and an operating method thereof are provided.

Figure 11:
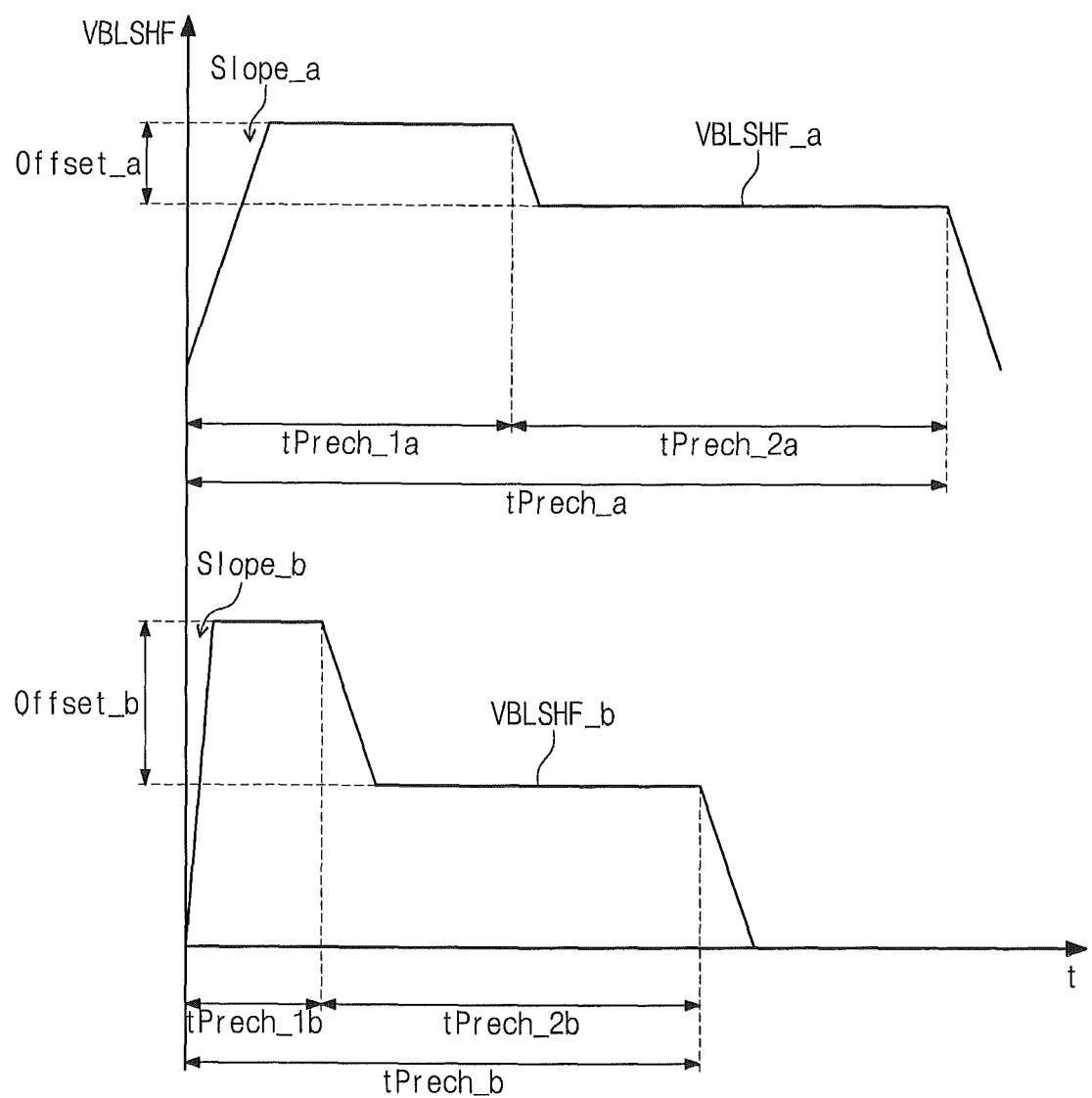
FIG. 11 is a drawing illustrating a precharge control signal in accordance with another embodiment of the inventive concept.

FIG. 11 is a drawing illustrating a precharge control signal in accordance with another embodiment of the inventive concept. Referring to FIG. 11, the nonvolatile memory device 120 can control an offset, a precharge time tPrech, and a slope of the precharge control signal VBLSHF. Unlike that illustrated in FIG. 8, the nonvolatile memory device 120 can control a slope of the second precharge control signal VBLSHF_b. The slope of the precharge control signal represents the degree of an increase of the precharge control signal VBLSHF during a first section tPrech_1. That is, in the case that slope of the precharge control signal VBLSHF increases, the sensing bit line is rapidly charged.

In the case that the nonvolatile memory device 120 operates in the first read mode, the nonvolatile memory device 120 can control the precharge control signal VBLSHF like the first precharge control signal VBLSHF_a. In the case that the nonvolatile memory device 120 operates in the second read mode, the nonvolatile memory device 120 can control the precharge control signal VBLSHF like the second precharge control signal VBLSHF_b. A second offset (offset_b) is greater than a first offset (offset_a), the first section tPrech_1a of the first precharge control signal VBLSHF_a is longer than the first section tPrech_1b of the second precharge control signal VBLSHF_b and a second slope (slope_b) is greater than a first slope (slope_a).

According to another embodiment described above, the nonvolatile memory device 120 can reduce the precharge time of the sensing bit line by controlling the slope of the precharge control signal.

Figure 12:
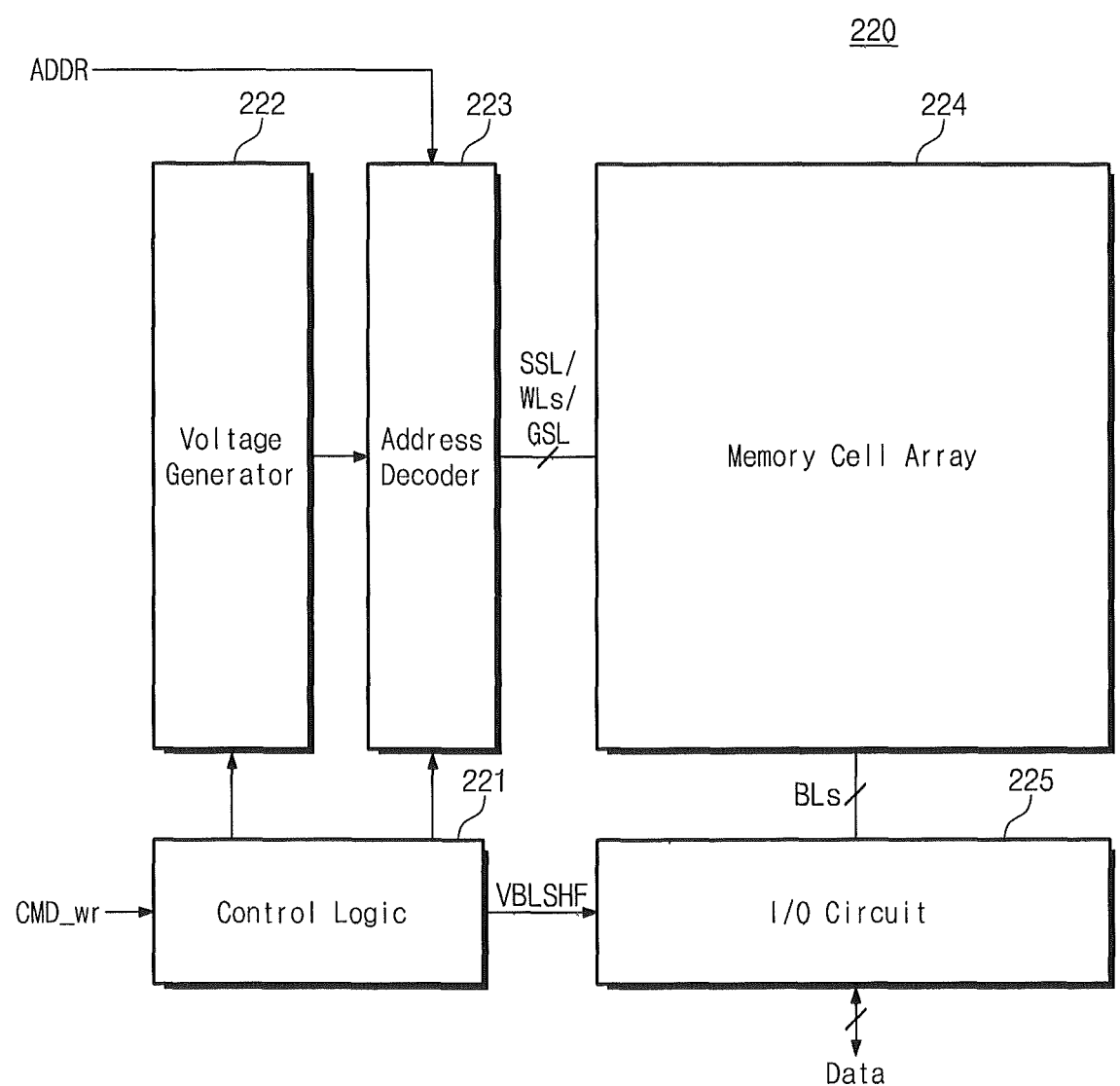
FIG. 12 is a block diagram illustrating a nonvolatile memory device in accordance with another embodiment of the inventive concept.

FIG. 12 is a block diagram illustrating a nonvolatile memory device in accordance with another embodiment of the inventive concept. Referring to FIG. 12, a nonvolatile memory device 220 includes control logic 221, a voltage generator 222, an address decoder 223, a memory cell array 224 and an input/output circuit 225. Because the control logic 221, the voltage generator 222, the address decoder 223, the memory cell array 224 and the input/output circuit 225 were described with reference to FIG. 2, a detailed description thereof is omitted.

Unlike the nonvolatile memory device 120 of FIG. 2, the nonvolatile memory device 220 of FIG. 12 receives a write command CMD_wr and write data DATA from a memory controller (not shown). The nonvolatile memory device 220 can write the received write data DATA in the memory cell array 224 in response to the received write command CMD_wr. At this time, the nonvolatile memory device 220 can perform a verify operation of the write data written in the memory cell array 224. The nonvolatile memory device 220 can selectively control a precharge control signal VBLSHF during the verify operation.

Figure 13:
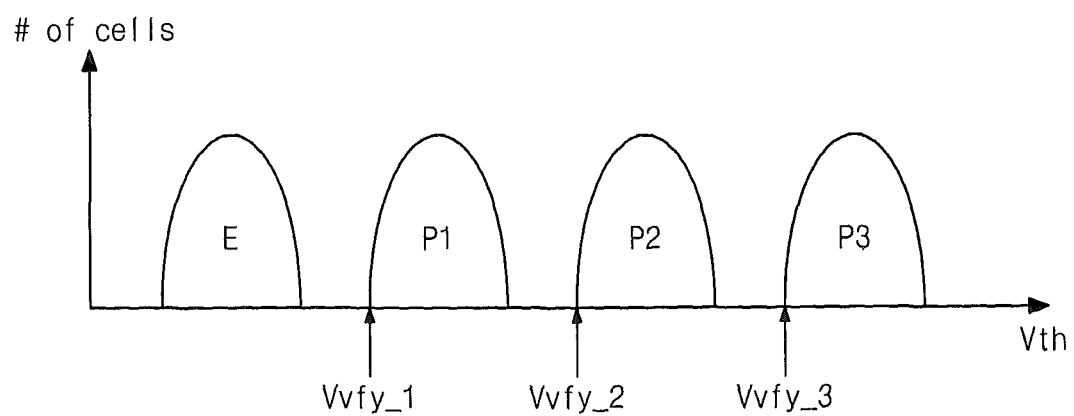
FIGS. 13 and 14 are drawings illustrating operations of a nonvolatile memory device illustrated in FIG. 12.
Figure 14:
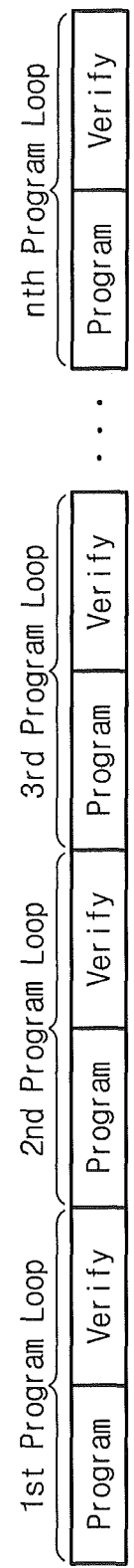

FIG. 13 is a drawing illustrating a distribution of threshold voltages of memory cells included in the memory cell array illustrated in FIG. 12. FIG. 14 is a drawing illustrating a program loop of the nonvolatile memory device illustrated in FIG. 12. The memory cells may be multi level cells (MLC). It is assumed that each of the memory cells is a 2-bit MLC. However, the inventive concept is not limited to the 2-bit MLC. The memory cells may be a SLC, a 3-bit MLC, a 4-bit MLC, or other type of memory cell.

Referring to FIGS. 12 to 14, the nonvolatile memory device 220 can program memory cells corresponding to an address ADDR to have any one state among an erase state E and first through third program states P1~P3 according to the received write command CMD_wr, data DATA AND address ADDR. After performing a program operation, the nonvolatile memory device 220 performs a verify operation of the programmed memory cells.

The nonvolatile memory device 220 sequentially applies a verify voltage to a selected word line to read out data of memory cells connected to the selected word line. The nonvolatile memory device 220 compares the read out data with the received data DATA to determine whether a program passes or fails.

For example, after performing a program operation, the nonvolatile memory device 220 applies a first verify voltage Vvfy_1 to verify a memory cell of an erase state E. After that, the nonvolatile memory device 220 applies second and third verify voltages Vvfy2 and Vvfy3 to sequentially verify first and second program states. For ease of description, the program operation and the verify operation refer to one program loop as illustrated in FIG. 14. After performing one program loop, the nonvolatile memory device 220 performs a program operation on program failed memory cells again. The nonvolatile memory device 220 repeatedly performs the program loop operation to write the received data DATA in the memory cell array 224.

As the number of times of program loop increase, the number of verified memory cells also increases. Because a verify operation of the verified memory cells is not needed, a bit line connected to the program-passed memory cells is in a ground state in a next verify operation. That is, as the number of program loops increase, the number of program-passed memory cells also increases and thereby the number of bit lines being precharged is reduced. If the number of program loop exceeds a reference value, bit lines adjacent to a bit line being precharged may be in a ground state. In other words, when the number of program loops exceeds a reference value, the nonvolatile memory device 220 can control the precharge control signal VBLSHF on the basis of the method described with reference to FIGS. 2 to 10.

In the case that the number of program loops exceeds a reference value, the nonvolatile memory device 220 can reduce the precharge time of the sensing bit line by controlling an offset and the precharge time of the precharge control signal VBLSHF. Thus, a nonvolatile memory device having improved performance and an operating method thereof are provided.

Figure 15:
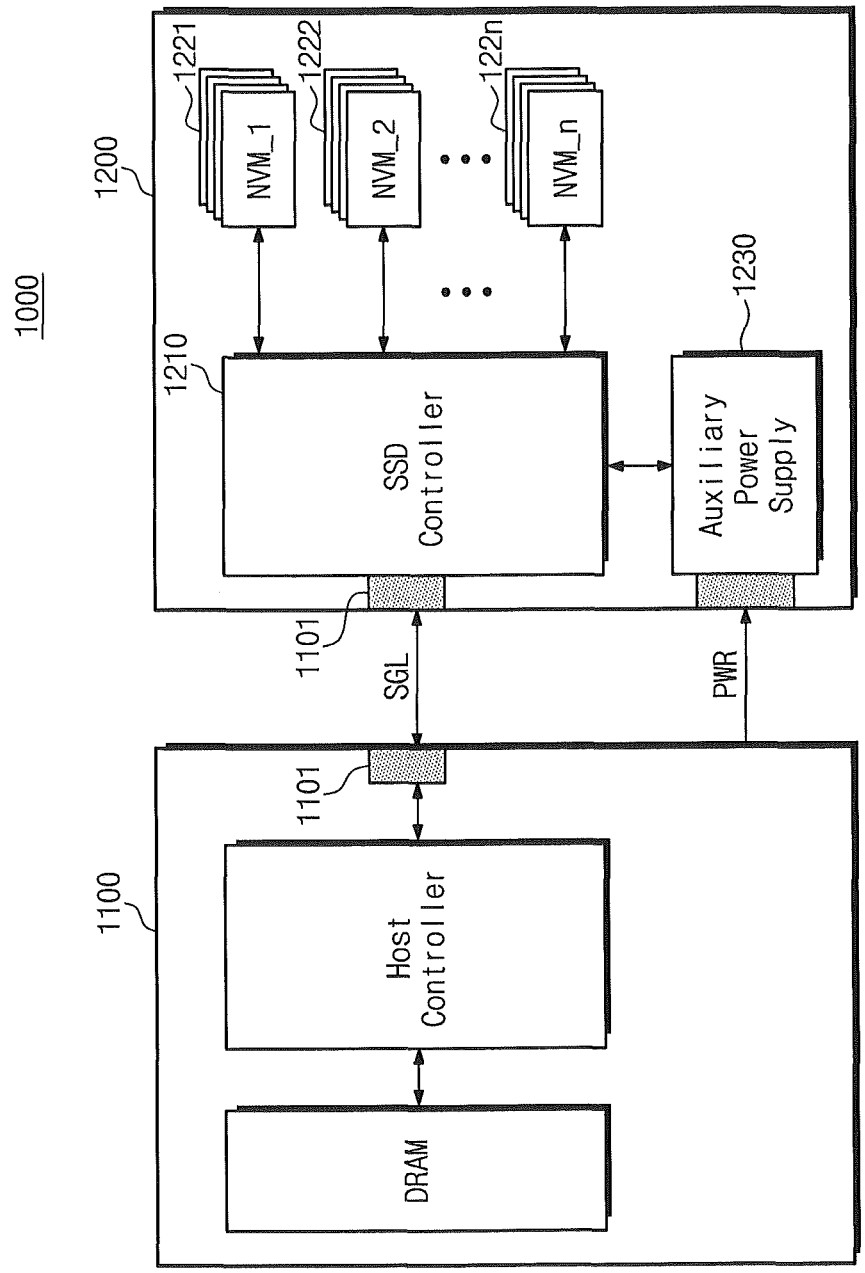
FIG. 15 is a block diagram illustrating a solid state drive (SSD) system to which a nonvolatile memory device in accordance with an embodiment of the inventive concept is applied.

FIG. 15 is a block diagram illustrating a solid state drive (SSD) system to which a nonvolatile memory device in accordance with embodiments of the inventive concept is applied.

Referring to FIG. 15, a SSD system 1000 includes a host 1100 and a SSD 1200. The host 1100 includes a host interface 1101, a DRAM 1110 and a host controller 1120.

The host 1100 writes data in the SSD 1200 or reads data stored in the SSD 1200. The host controller 1120 transmits a signal SGL, such as a command, an address, state information, etc. to the SSD 1200 through the host interface 1101. The DRAM 1110 is a main memory of the host 1100. The host 1100 can exchange a signal SGL with the SSD 1200 through the host interface 1101. The host interface 1101 may include various interfaces, such as a USB (universal serial bus), a MMC (multimedia card), a PCI (peripheral component interconnection), a PCI-E (PCI-express), an ATA (advanced technology attachment), a serial-ATA, a parallel-ATA, a SCSI (small computer small interface), an ESDI (enhanced small disk interface), an IDE (integrated drive electronics), and a MIPI (mobile industry processor interface).

The SSD 1200 exchanges a signal SGL with the host 1100 through the host interface 1101 and is supplied with power through a power connector 1202. The SSD 1200 may include a plurality of nonvolatile memories 1221~422n, a SSD controller 1210 and an auxiliary power supply 1230. The nonvolatile memories 1221~122n can be embodied by a PRAM, a MRAM, a ReRAM, a FRAM, etc. besides a NAND flash memory.

The nonvolatile memories 1221~422n are used as a storage medium of the SSD 1200. The nonvolatile memories 1221~122n can be connected to the SSD controller 1210 through a plurality of channels CH1~CHn. At least one nonvolatile memory device can be connected to one channel. Nonvolatile memory devices connected to one channel can be connected to a same data bus.

The SSD controller 1210 exchanges a signal SGL with the host 1100 through the host interface 1101. The signal SGL may include a command, an address, data, etc. The SSD controller 1210 writes data in a corresponding nonvolatile memory device or reads data from a corresponding nonvolatile memory device according to a command of the host 1100.

The auxiliary power supply 1230 is connected to the host 1100 through the power connector 1202. The auxiliary power supply 1230 can be supplied with power from the host 1100 to be charged. The auxiliary power supply 1230 can be located inside or outside the SSD 1200. For example, the auxiliary power supply 1230 can be located on a main board and can supply auxiliary power to the SSD 1200.

In exemplary embodiments, the nonvolatile memories 1221~122n can control a precharge control signal of a sensing bit line on the basis of the method described with reference to FIGS. 1 to 14. The nonvolatile memories 1221~122n can precharge bit lines on the basis of the controlled precharge control signal to perform a read operation or a verify operation.

Figure 16:
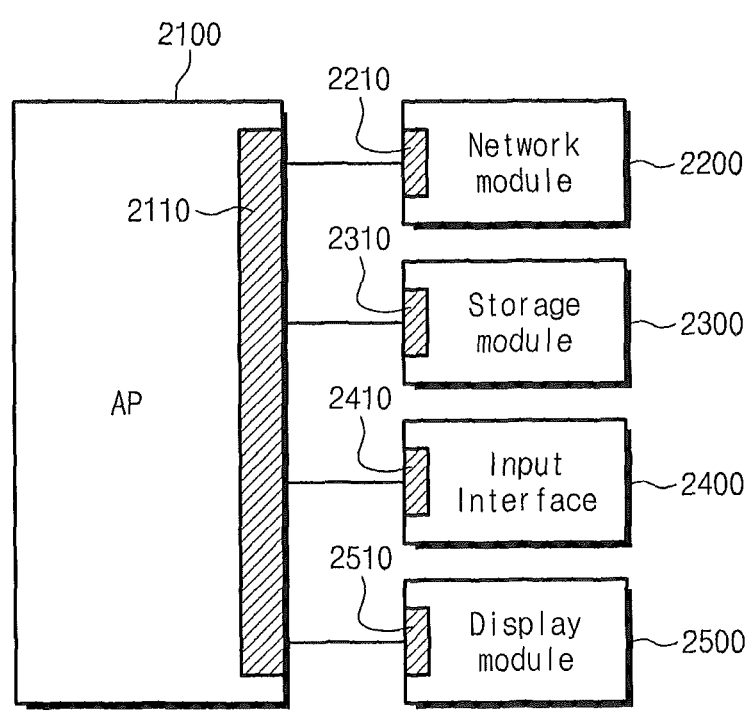
FIG. 16 is a block diagram illustrating a mobile system including a nonvolatile memory device in accordance with an embodiment of the inventive concept.

FIG. 16 is a block diagram illustrating a mobile system including a nonvolatile memory device in accordance with embodiments of the inventive concept.

A mobile system 2000 can be provided by computing systems, such as an ultra mobile PC (UMPC), a workstation, a net-book, a personal digital assistants (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a digital audio recorder, a digital audio player, a digital picture recorder, a digital picture player, a digital video recorder, a digital video player, etc.

Referring to FIG. 16, a mobile system 2000 may include an application processor (AP) 2100, a network module 2200, a storage module 2300, an input interface 2400, and a display module 2500.

The AP 2100 can drive constituent elements included in the mobile system 2000, that is, an operating system (OS). The AP 2100 may include a graphic engine, controllers controlling constituent elements included in the mobile system 2000, and interfaces.

The network module 2200 can communicate with external devices. The network module 2200 can support wireless communication, such as code division multiple access (CDMA), global system for mobile communication (GSM), wideband CDMA (WCDMA), CDMA-2000, time division multiple access (TDMA), long term evolution (LTE), Wimax, WLAN, Bluetooth, WI-DI, etc.

The storage module 2300 can store data. The storage module 2300 can store data received from an external source. The storage module 2300 can transmit data stored in the storage module 2300 to the AP 2100. The storage module 2300 can be embodied by a semiconductor memory device, such as a DRAM, a SDRAM, a SRAM, a DDR SDRAM, a DDR2 SDRAM, a DDR3 SDRAM, a PRAM, a MRAM, a RRAM, a NAND flash, a NOR flash, etc. The storage module 2300 may include the nonvolatile memory device described with reference to FIGS. 1 through 14. A nonvolatile memory device included in the storage module 2300 can control the precharge control signal VBLSHF on the basis of the method described with reference to FIGS. 1 through 4 to perform read and write operations.

The input interface 2400 provides an interface, which inputs data or a command in the mobile system 2000. The input interface 2400 includes input devices, such as a camera, a touch screen, an action recognition module, a mike, etc. The display module 2500 can output an image, a graphic, etc. under the control of the AP 2100.

The AP 2100 and the storage module 2300 can communicate with each other on the basis of a single interface. For example, the AP 2100 and the storage module 2300 can be connected to each other through host interfaces 2110 and 2310. The network module 2200, the storage module 2300, the input interface 2400, and the display module 2500 can be connected to the AP 2100 through respective interfaces 2210, 2310, 2410, 2510, and the interface 2110. The interfaces 2110, 2210, 2310, 2410, and 2510 can be provided based on a common M-PHY interface. That is, AP 2100 can control constituent elements included in the mobile system 2000 on the basis of the single interface.

Figure 17:
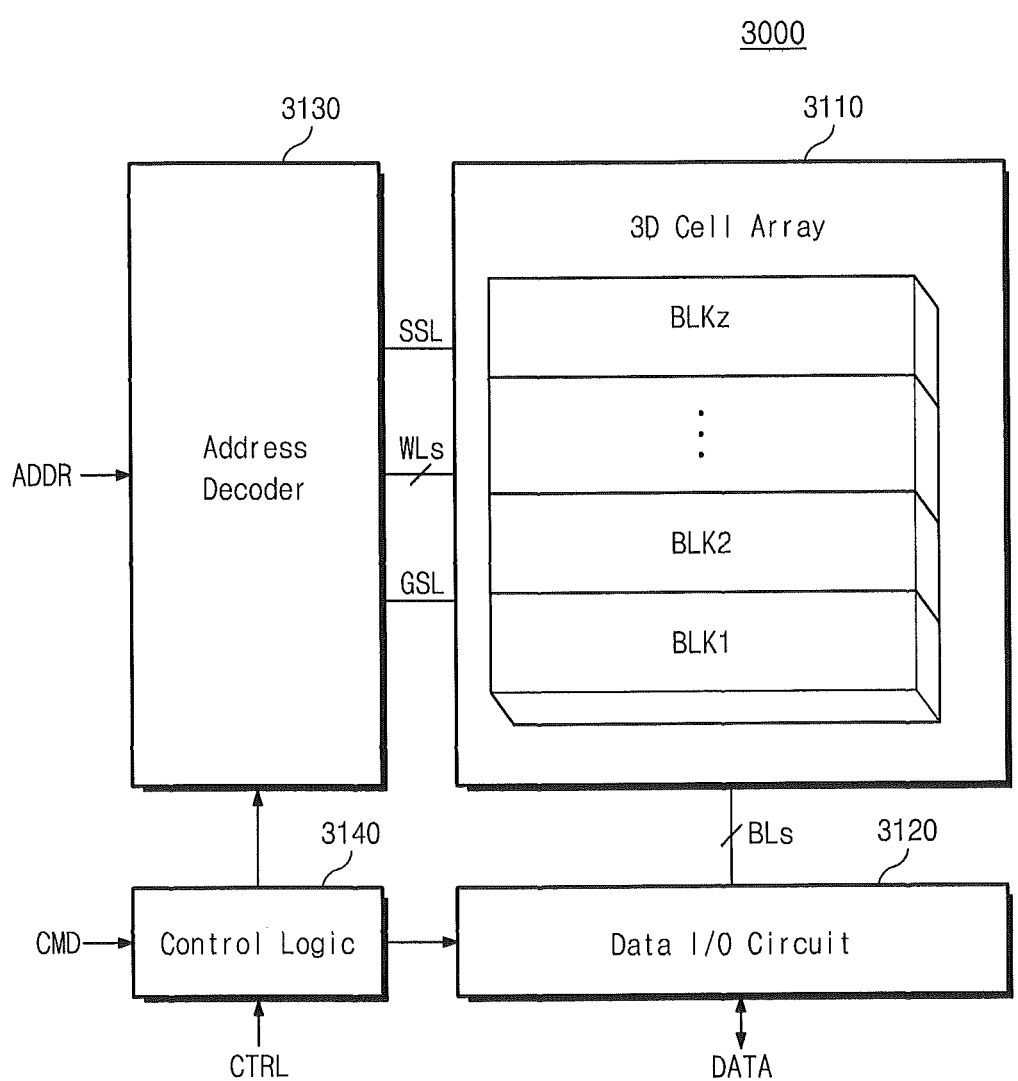
FIG. 17 is a block diagram illustrating a nonvolatile memory device in accordance with still another embodiment of the inventive concept.

FIG. 17 is a block diagram illustrating a nonvolatile memory device in accordance with still another embodiment of the inventive concept.

Referring to FIG. 17, a nonvolatile memory device 3000 includes a three-dimensional cell array 3110, a data input/output circuit 3120, an address decoder 3130 and control logic 3140.

The three-dimensional cell array 3110 includes a plurality of memory blocks BLK1~BLKz. Each memory block may have a three-dimensional structure (or a vertical structure). In a memory block having a two-dimensional structure, memory cells are formed in a direction to be parallel to a substrate. However, in a memory block having a three-dimensional structure, memory cells are formed in a direction perpendicular to a substrate. Each memory block forms an erase unit of the nonvolatile memory device 3000.

The data input/output circuit 3120 is connected to the three-dimensional cell array 3110 through a plurality of bit lines BLs. The data input/output circuit 3120 receives data from an external source or outputs data read from the three-dimensional cell array 3110 to an external destination. The address decoder 3130 is connected to the three-dimensional cell array 3110 through a plurality of word line WLs and select lines SSL and GSL. The address decoder 3130 receives an address ADDR to select a word line.

The control logic 3140 controls program, read, and erase operations of the nonvolatile memory device 3000. When a program operation is performed, the control logic 3140 provides a program voltage to a selected word line by controlling the address decoder 3130 and makes data be programmed by controlling the data input/output circuit 3120.

The control logic 3140 can perform a read or program verification operation on the basis of the method described with reference to FIGS. 1 through 14.

Figure 18:
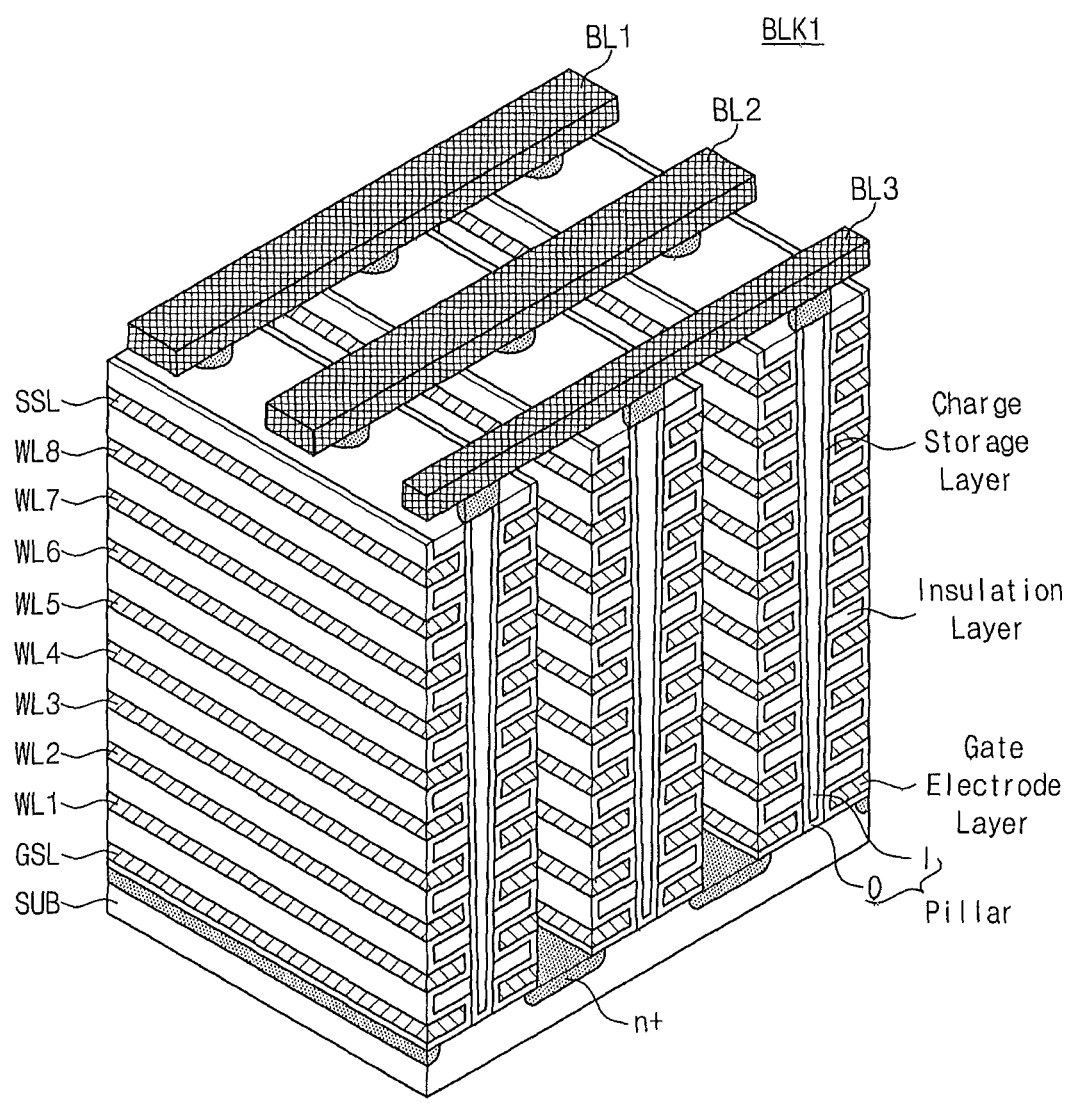
FIGS. 18 and 19 are perspective views illustrating a three-dimensional structure of a memory block illustrated in FIG. 17.

FIG. 18 is a perspective view illustrating a three-dimensional structure of a memory block illustrated in FIG. 17. Referring to FIG. 18, a memory block BLK1 is formed in a direction perpendicular to a substrate SUB. An n+ doping region is formed in the substrate SUB. A gate electrode layer and an insulating layer are alternately deposited on the substrate SUB. A charge storage layer may be formed between the gate electrode layer and the insulating layer.

A pillar having a V charter shape is formed by patterning the gate electrode layer and the insulating layer in a vertical direction. The pillar penetrates the gate electrode layer and the insulating layer to be connected to the substrate SUB. An outside part O of the pillar may be constituted by a channel semiconductor and an inside part I of the pillar may be constituted by an insulating material, such as silicon oxide.

The gate electrode layer of the memory block BLK1 may be connected to a ground select line GSL, a plurality of word lines WLs, and a string select line SSL. The pillar of the memory block BLK1 may be connected to a plurality of bit lines BL1~BL3. In FIG. 18, one memory block BLK1 has two select line GSL and SSL, eight word lines WL1~WL8, and three bit lines BL1~BL3 but the inventive concept is not limited to this example.

Figure 19:
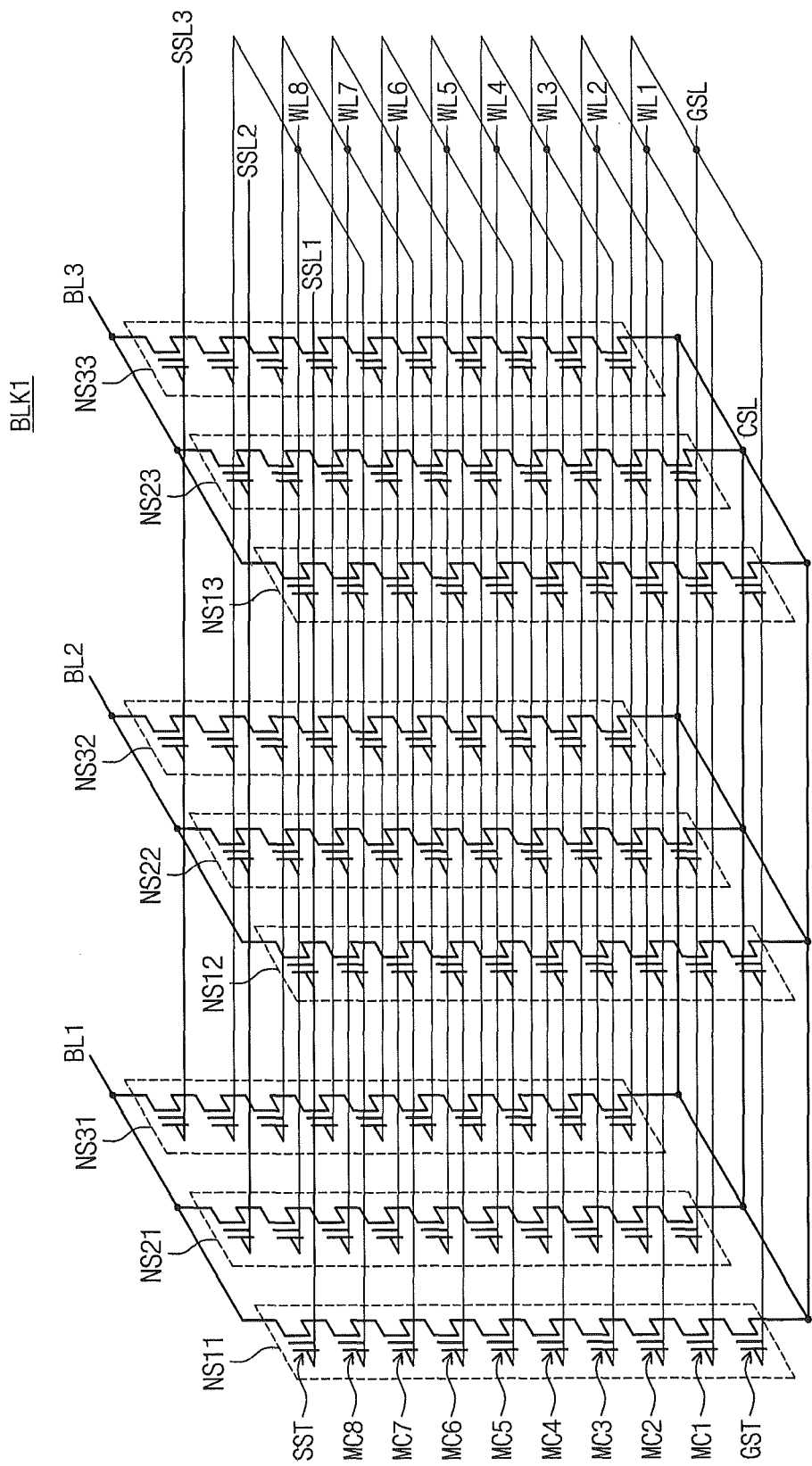

FIG. 19 is an equivalent circuit of the memory block illustrated in FIG. 18. Referring to FIG. 19, NAND strings NS11~NS33 are connected between the bit lines BL1~BL3 and a common source line CSL. Each NAND string includes a string select transistor SST, a plurality of memory cells MC1~MC8, and a ground select transistor GST.

The string select transistors SST are connected to string select lines SSL1~SSL3. The memory cells MC1~MC8 are connected to respective word lines WL1~WL8. The ground select transistors GST are connected to a ground select line GSL. The string select transistor SST is connected to the bit line BL and the ground select transistor GST is connected to the common source line CSL.

Word lines located at a same height are connected in common and the string select lines SSL1~SSL3 are separated from one another. In the case that memory cells (hereinafter referred to as a page), which are connected to the first word line WL1 and belong to the NAND strings NS11, NS12, and NS13 are programmed, the first word line WL1 and the first select line SSL1 are selected.

According to an embodiment of the inventive concept, a nonvolatile memory device supports a plurality of read modes. A nonvolatile memory device can control a precharge control signal VBLSHF for precharging a bit line according to a read mode. Because precharge time of a bit line is reduced according to the precharge control signal, a nonvolatile memory device having improved performance and an operating method thereof are provided.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the present invention. Accordingly, all such modifications are intended to be included within the scope of the present invention as defined in the claims. The present invention is defined by the following claims, with equivalents of the claims to be included therein.

What is claimed is:

1. An operating method of a nonvolatile memory device comprising:
receiving a read command from a memory controller;
determining a read mode based on the received read command;
controlling a precharge time and an offset of a precharge control signal according to the determination result; and precharging a sensing bit line among bit lines to a precharge voltage based on the controlled precharge control signal,
wherein the sensing bit line is a bit line being precharged according to the determined read mode among the bit lines,
wherein the precharge time comprises first and second sections,
wherein the offset is a level difference between the precharge control signal of the first section and the precharge control signal of the second section; and
wherein the precharge control signal is a signal for controlling precharge switches connected to the bit lines.

2. The operating method of a nonvolatile memory device of claim 1, wherein the determining a read mode on the basis of the received read command comprises determining whether the received read command indicates a first read mode or a second read mode,
wherein the first read mode is a full-page read mode and the second read mode is a half-page read mode.

3. The operating method of a nonvolatile memory device of claim 2, wherein in the case that the received read command is the second read mode, a bit line adjacent to the sensing bit line is in a ground state.

4. The operating method of a nonvolatile memory device of claim 2, wherein the controlling precharge time and an offset of a precharge control signal according to the determination result comprises setting the first section of the precharge control signal to a first time when the received read command indicates the first read mode and setting the first section of the precharge control signal to a second time which is less than the first time when the received read command indicates the second read mode.

5. The operating method of a nonvolatile memory device of claim 4, wherein the controlling precharge time and an offset of a precharge control signal according to the determination result further comprises setting an offset of the precharge control signal to a first reference value when the received read command indicates the first read mode and setting the offset of the precharge control signal to a second reference value which is greater than the first reference value when the received read command indicates the second read mode.

6. The operating method of a nonvolatile memory device of claim 5, wherein a time that the sensing bit line is precharged based on a precharge control signal having the first section of the second time and the offset of the second reference value is less than a time that the sensing bit line is precharged based on a precharge control signal having the first section of the first time and the offset of the first reference value.

7. The operating method of a nonvolatile memory device of claim 4, wherein the controlling precharge time and an offset of a precharge control signal according to the determination result comprises setting a slope of the precharge control signal to a first slope when the received read command indicates the first read mode and setting the slope of the precharge control signal to a second slope which is greater than the first slope when the received read command indicates the second read mode, and
wherein the slope indicates a rate of voltage level increment in the precharge control signal of the first section.

8. The operating method of a nonvolatile memory device of claim 1, further comprising sensing a voltage change of the precharged sensing bit lines to detect a program state of memory cells connected to the sensing bit lines.

9. The operating method of a nonvolatile memory device of claim 1, wherein a first peak value of the offset when the received read command indicates a first read mode is less than a second peak value of the offset when the received read command indicates a second read mode.

10. A method, comprising:
receiving a read command from a memory controller;
determining a read mode based on the read command, the read mode comprising a first read mode for reading an entire page of a memory device and a second mode for reading a portion of a page of the memory device;
generating a precharge control signal having first and second time segments and having a steady state offset between voltage levels of the precharge control signal during the first and second time segments based on the read mode;
precharging a sensing bit line of a plurality of bit lines using the precharge control signal;
wherein the precharge control signal is a signal for controlling precharge switches connected to the plurality of bit lines.

11. The method of claim 10, wherein the steady state offset for the first mode is less than the steady state offset for the second mode.

12. The method of claim 10, wherein the first time segment for the first mode is longer than the first time segment for the second mode.

13. The method of claim 10, wherein a first combined time of the first and second segments for the first mode is longer than a second combined time of the first and second time segments for the second mode.

14. The method of claim 10, wherein ones of the plurality of bit lines adjacent to the sensing bit line are in a ground state for the second mode.

15. The method of claim 10, further comprising:
performing a read operation on the memory device responsive to precharging the sensing bit line.

16. A program method of a nonvolatile memory device comprising:
receiving a write command and write data from a memory controller; and
performing a plurality of program loops so that the received write data is written according to the received write command,
wherein each of the program loops comprises a program operation writing the received write data and a verify operation verifying the written write data,
wherein the performing the program loops comprises controlling precharge time and an offset of a precharge control signal when the number of program loops exceeds a reference value and performing the verify operation on the basis of the controlled precharge control signal,
wherein the precharge time comprises first and section sections, and
wherein the offset is a voltage level difference between the precharge control signal of the first section and the precharge control signal of the second section.

17. The program method of a nonvolatile memory device of claim 16, wherein the controlling precharge time and an offset of a precharge control signal when the number of program loops exceeds a reference value and performing the verify operation on the basis of the controlled precharge control signal comprises controlling the precharge control signal so that the first section of the precharge control signal is shorter than a first section of the precharge control signal when the number of program loops is less than a reference value.

18. The program method of a nonvolatile memory device of claim 17, wherein the controlling precharge time and an offset of a precharge control signal when the number of times of program loops exceeds a reference value and performing the verify operation on the basis of the controlled precharge control signal comprises:
controlling the precharge control signal so that the offset of the precharge control signal is greater than an offset of the precharge control signal when the number of times of program loops is less than a reference value.

19. The program method of a nonvolatile memory device of claim 16, wherein the controlling precharge time and an offset of a precharge control signal when the number of times of program loops exceeds a reference value and performing the verify operation on the basis of the controlled precharge control signal comprises controlling the precharge control signal so that a slope of the precharge control signal is greater than a slope of the precharge control signal when the number of times of program loops is less than a reference value, and
wherein the slope is a rate of voltage level increment in the precharge control signal during the first section.

20. The program method of a nonvolatile memory device of claim 16, wherein the controlling precharge time and an offset of a precharge control signal when the number of times of program loops exceeds a reference value and performing the verify operation on the basis of the controlled precharge control signal comprises:
precharging a verify bit line on the basis of the controlled precharge control signal; and
verifying a program state of a memory cell connected to the verify bit line,
wherein bit lines adjacent to the verify bit line are in a ground state.

* * * * *